United States Patent
Fishman et al.

(10) Patent No.: US 9,530,750 B2
(45) Date of Patent: Dec. 27, 2016

(54) METHOD OF CLAMPING A SEMICONDUCTOR ASSEMBLY

(75) Inventors: Oleg S. Fishman, Maple Glen, PA (US); Satyen N. Prabhu, Voorhees, NJ (US)

(73) Assignee: INDUCTOTHERM CORP., Rancocas, NJ (US)

( * ) Notice: Subject to any disclaimer, the term of this patent is extended or adjusted under 35 U.S.C. 154(b) by 1126 days.

(21) Appl. No.: 13/416,429

(22) Filed: Mar. 9, 2012

(65) Prior Publication Data

US 2012/0192392 A1  Aug. 2, 2012

Related U.S. Application Data

(62) Division of application No. 12/019,066, filed on Jan. 24, 2008, now Pat. No. 8,134,835.

(60) Provisional application No. 60/886,672, filed on Jan. 26, 2007.

(51) Int. Cl.
*G01R 31/28* (2006.01)
*H01L 23/00* (2006.01)

(52) U.S. Cl.
CPC ..... *H01L 24/72* (2013.01); *H01L 2924/01013* (2013.01); *H01L 2924/01033* (2013.01); *H01L 2924/01082* (2013.01); *H01L 2924/13034* (2013.01); *Y10T 24/44974* (2015.01); *Y10T 29/41* (2015.01)

(58) Field of Classification Search
CPC .......... H01L 24/72; H01L 24/85; H01L 24/90; H01L 24/91; H01L 24/98; Y10T 29/41; Y10T 29/49002; Y10T 29/49004; Y10T 29/49036
USPC .... 29/25.01, 592.1, 593; 257/714, 718, 727; 361/679.46, 679, 54, 704, 710, 717
See application file for complete search history.

(56) References Cited

U.S. PATENT DOCUMENTS

| | | | | |
|---|---|---|---|---|
| 3,447,118 A * | 5/1969 | Ferree | ............................. | 338/21 |
| 3,571,663 A * | 3/1971 | Hungate | ....................... | 361/710 |
| 3,654,528 A * | 4/1972 | Barkan | ......................... | 257/714 |
| 3,789,248 A * | 1/1974 | Jaecklin et al. | ............... | 310/355 |
| 3,852,803 A * | 12/1974 | Walmet et al. | ................ | 257/715 |
| 3,943,426 A * | 3/1976 | Thiele et al. | .................. | 257/665 |
| 4,097,036 A * | 6/1978 | Henke | .......................... | 269/254 R |
| 4,636,917 A * | 1/1987 | Jouanny | ........................ | 361/709 |
| 4,672,422 A * | 6/1987 | Schierz | ......................... | 257/714 |
| 5,940,273 A * | 8/1999 | Fishman et al. | .............. | 361/704 |
| 6,014,315 A * | 1/2000 | McCullough et al. | ........ | 361/704 |
| 6,324,073 B1 * | 11/2001 | Mikosz et al. | ................ | 361/809 |
| 6,760,223 B2 * | 7/2004 | Wells et al. | ................... | 361/704 |

* cited by examiner

*Primary Examiner* — Paul D Kim
(74) *Attorney, Agent, or Firm* — Philip O. Post

(57) ABSTRACT

The present invention relates to a method of clamping a semiconductor assembly with a desired compression force equally distributed across the opposing surfaces of the devices and associated components of the semiconductor assembly.

5 Claims, 4 Drawing Sheets

METHOD OF CLAMPING A SEMICONDUCTOR ASSEMBLY

CROSS-REFERENCE TO RELATED APPLICATIONS

This is a divisional application of application Ser. No. 12/019,066, filed Jan. 24, 2008 now U.S. Pat. No. 8,134,835, which application claims the benefit of U.S. Provisional Application No. 60/886,672, filed Jan. 26, 2007, both of which applications are hereby incorporated herein by reference in their entireties.

FIELD OF THE INVENTION

The present invention relates to a device for compression clamping of semiconductor devices and associated components.

BACKGROUND OF THE INVENTION

U.S. Pat. No. 5,940,273 (the 273 patent) discloses a semiconductor clamping device. FIG. 1 herein is FIG. 1 from the 273 patent and is used to describe the clamping device taught in the 273 patent. Referring to FIG. 1, the clamping device in the 273 patent teaches a single, centrally located (over semiconductor device (12)) pressure distribution member (48) that is used to establish a desired magnitude of compression force between semiconductor device (12) and associated components, namely heat dissipating devices (80) and (82) and electrical contact members (102). Initially, prior to complete assembly of the components shown in FIG. 1, the desired magnitude of compression force is applied to pressure distribution member (48) by compressing the pressure distribution member relative to jaw (18). To complete assembly, nuts (72) and (74) at one end of tie rods (22) and (24), respectively, are tightened to a position at which pressure distribution member (48) indicates the desired clamping pressure force has been applied between the semiconductor device and associated components. This occurs when washer (66) of the pressure distribution member, which washer was initially nonrotatable due to the applied compression force, is free to rotate.

Although the clamping device disclosed in the 273 patent works satisfactorily, the electrically conducting planar surfaces (86) of semiconductor device (12) in FIG. 1, continue to increase in surfaces areas, as exemplified, for example, by design advancements for a disc-type (also referred to as "hockey puck") semiconductor device, such as a silicon controlled rectifier (SCR). A clamping device with a single pressure distribution member can lead to isolated hot spots, for example, on the interfacing planar surfaces of semiconductor device (12) and associated semiconductor components due to unequal compression forces across the diameter of the planar surfaces. Therefore there is a need for an improved apparatus and method of clamping together semiconductor devices and associated components to achieve uniform compression forces across interfacing planar surfaces.

SUMMARY OF THE INVENTION

In one aspect the present invention is a method of applying a desired magnitude of compression force between one or more semiconductor devices and associated semiconductor components. A clamp comprises a pair of opposing jaws joined by a pair of tie rods connected near the opposing ends of each one of the pair of the opposing jaws. A clamp pressure set point assembly comprising a clamp pressure adjustable set point element and a clamp set pressure indicator element is located on each one of the tie rods adjacent to the inner surface of the first jaw of the pair of opposing jaws. A compression force equal in magnitude to one half of the desired compression force to be applied across the one or more semiconductor devices and associated semiconductor components is applied between the first jaw and each one of the clamp pressure set point assemblies on each of the tie rods. Assembly of the clamp with the one or more semiconductor devices and associated semiconductor components disposed between the pair of opposing jaws and within the pair of opposing tie rods is completed, and a compression adjustment fastener at the end of each one of the pair of tie rods associated with the second jaw of the pair of opposing jaws is adjusted to a position at which the clamp set pressure indicator element of each clamp pressure set point assembly indicates the desired compression force is applied across the one or more semiconductor devices and associated semiconductor components.

In some examples of the invention a pressure distribution element may be interposed between each of the pair of opposing jaws and the one or more semiconductor devices and associated semiconductor components.

In some examples of the invention the clamp set pressure indicator element may comprise a large washer interposed between two smaller washers and the clamp pressure adjusting set point element may be a threaded nut that press the washers against the inner surface of the first jaw so that when the large washer transitions from being nonrotatable by hand to being rotatable by hand the desired magnitude of compression force has been applied across the one or more semiconductor devices and associated semiconductor components.

The above and other aspects of the invention are set forth in this specification and the appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 1:
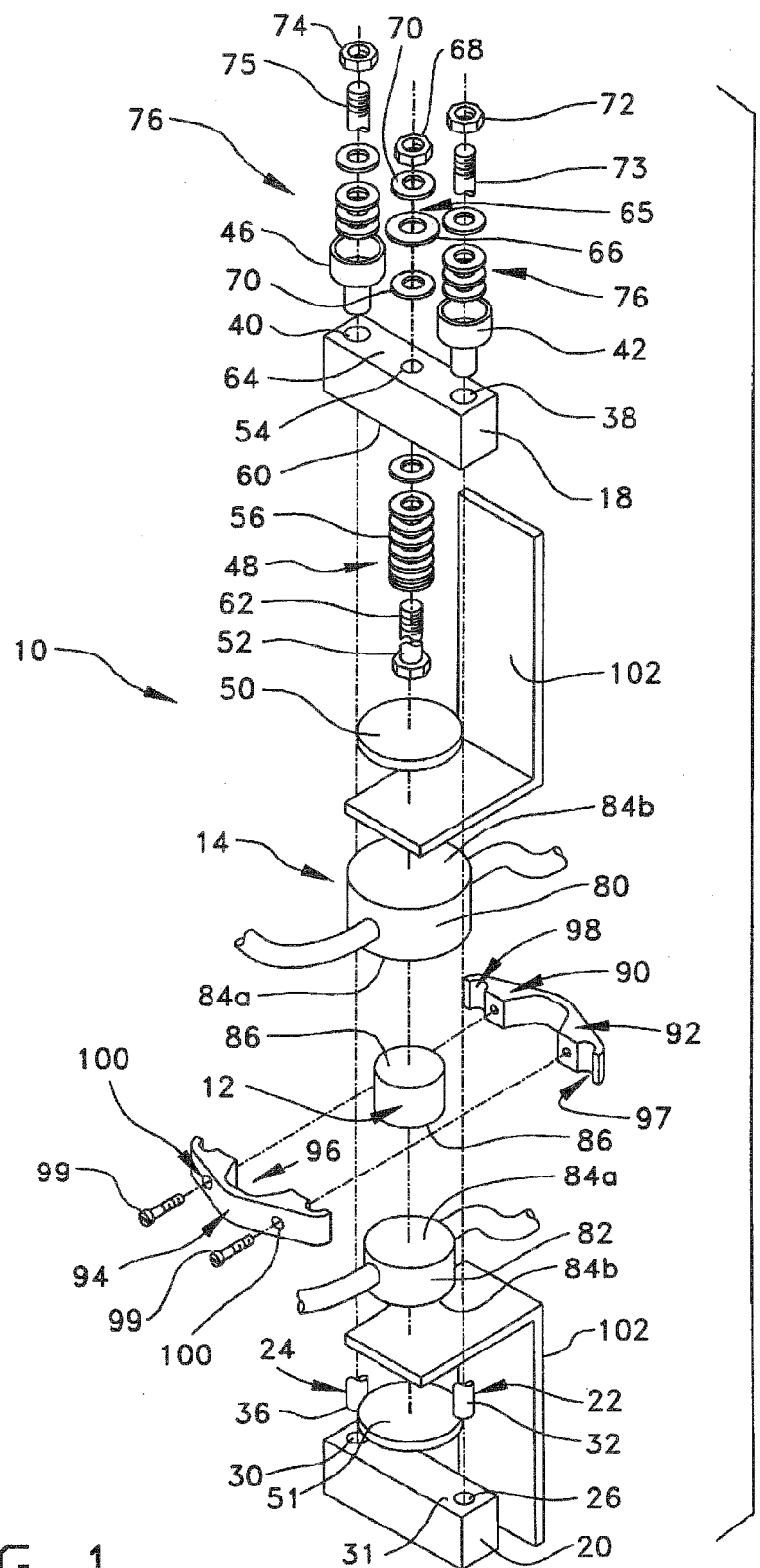
FIG. 1 is an illustration of a prior art semiconductor clamping device.
Figure 2:
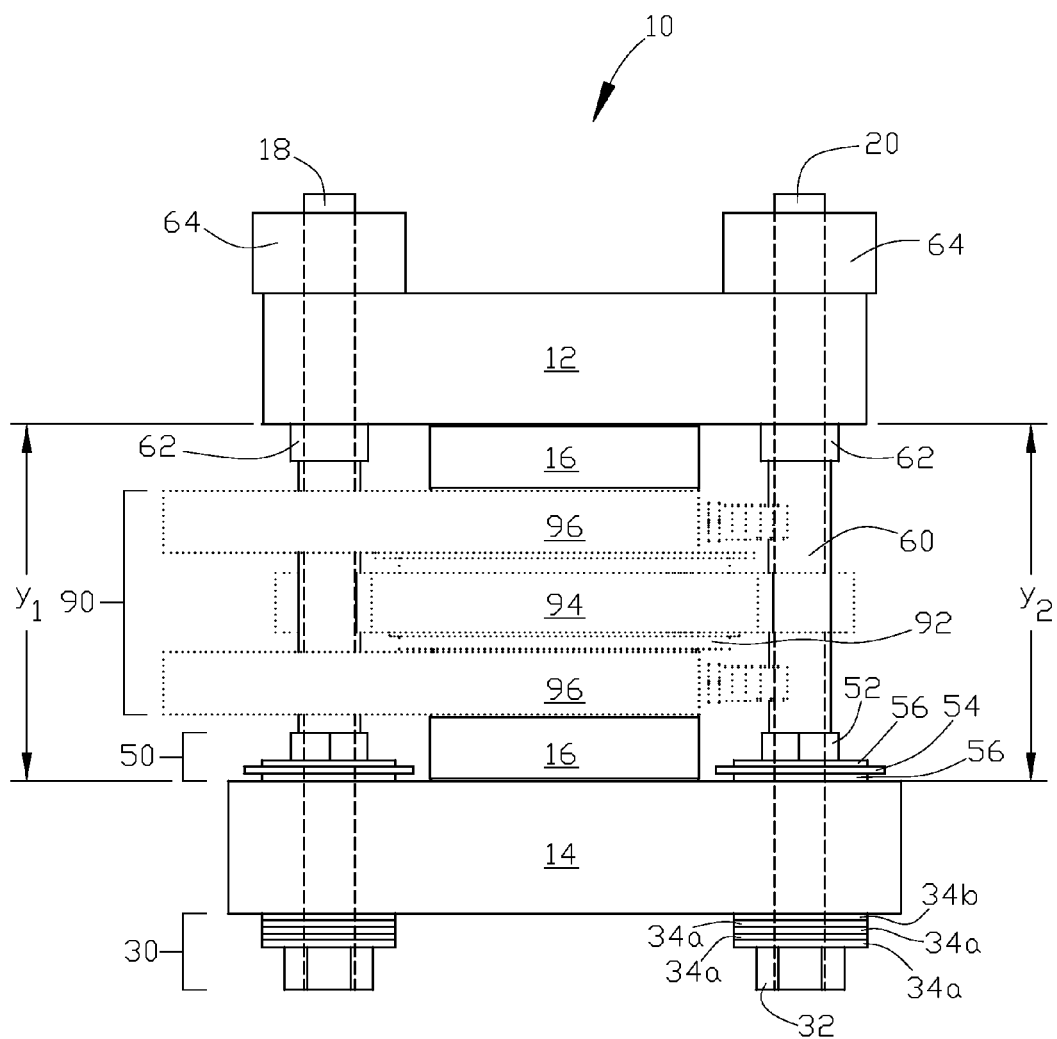
FIG. 2 is a front elevation view of one example of a clamping device of the present invention.
Figure 3:
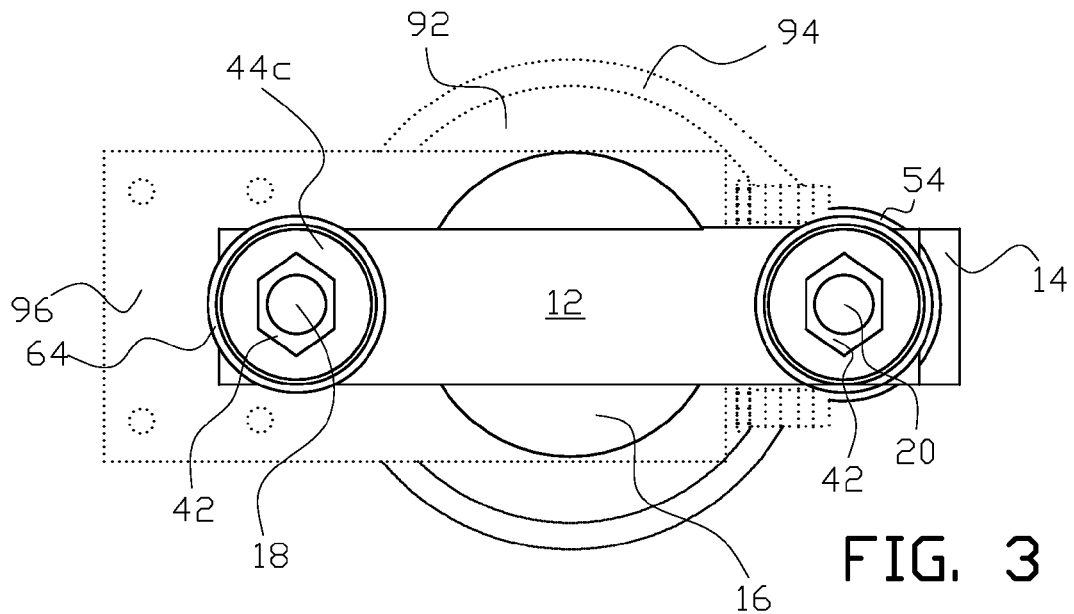
FIG. 3 is a top plan view of the clamping device illustrated in FIG. 2.
Figure 4:
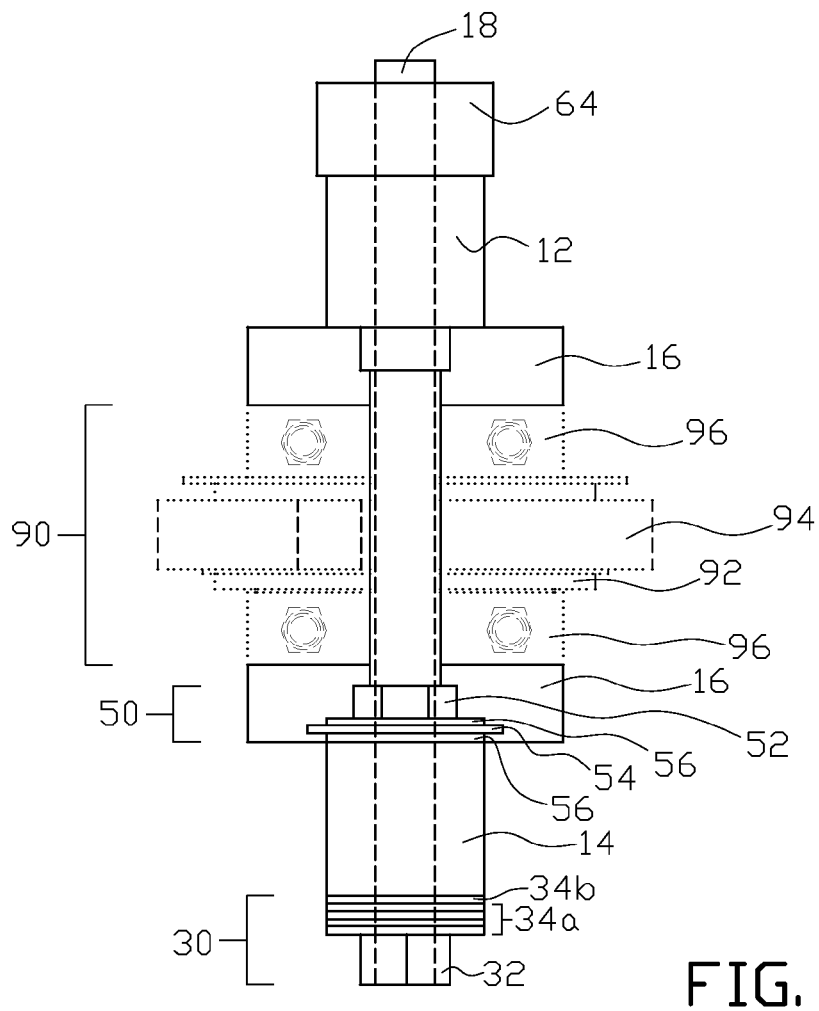
FIG. 4 is a side elevation view of the clamping device illustrated in FIG. 2.

In FIG. 2 through FIG. 5, there is illustrated one example of the semiconductor clamping device 10 of the present invention. In the figures a typical, but non-limiting semiconductor device and supporting semiconductor elements, collectively refereed to as semiconductor assembly 90 are shown in dotted lines (in FIG. 2, FIG. 3 and FIG. 4) to distinguish them from clamping device 10. In the figures semiconductor device 92 may be, for example, an SCR or diode of a disc or hockey puck design, and the supporting semiconductor components may be centering cup 94 (for holding the semiconductor device in place) and chill blocks 96 (for removing heat from the semiconductor component). Not shown in the drawings for semiconductor assembly 90 are electrical conductors, for example, flat electrical bus bars, each one of which may be partially sandwiched between each chill block 96 and adjacent pressure distribution element 16 (described below). The electrical conductors are used to transmit electrical power to and from the semiconductor devices. The term "semiconductor assembly" as used herein refers to at least one semiconductor device, which is placed between one or more associated semiconductor components for a particular arrangement of a semiconductor assembly.

Clamping device 10 comprises opposing jaws 12 and 14, and pressure distribution elements 16, which are positioned on opposing sides of semiconductor assembly 90 as shown in the figures. In some examples of the invention, the pressure distribution elements may be integral with the adjacent jaw. The tie rods described below may pass through only the jaws, or through both the jaws and pressure distribution elements. The jaws and pressure distribution elements may be of any suitable shapes, for example bars and disks, respectively, and formed from any suitable materials such as aluminum. In some examples of the invention, the pressure distribution elements may serve alone, or in combination with other elements, as heat sinks or heat dissipating devices for the semiconductor device. The opposing jaws and pressure distribution elements are held together by tie rods 18 and 20, each of which pass through openings 12a and 14a in the jaws and are restrained at opposing ends by fastener (retaining) assemblies, as described below. Rods 18 and 20 may be formed from a stainless steel, and may be at least partially threaded along their lengths, as required to accommodate the fasteners and clamp pressure adjustment assemblies used in a particular application. The rods may also be allthread threaded rods. Further the rods may be coated with an electrical insulating material, or alternatively formed from a non-electrically conductive material.

Figure 5:
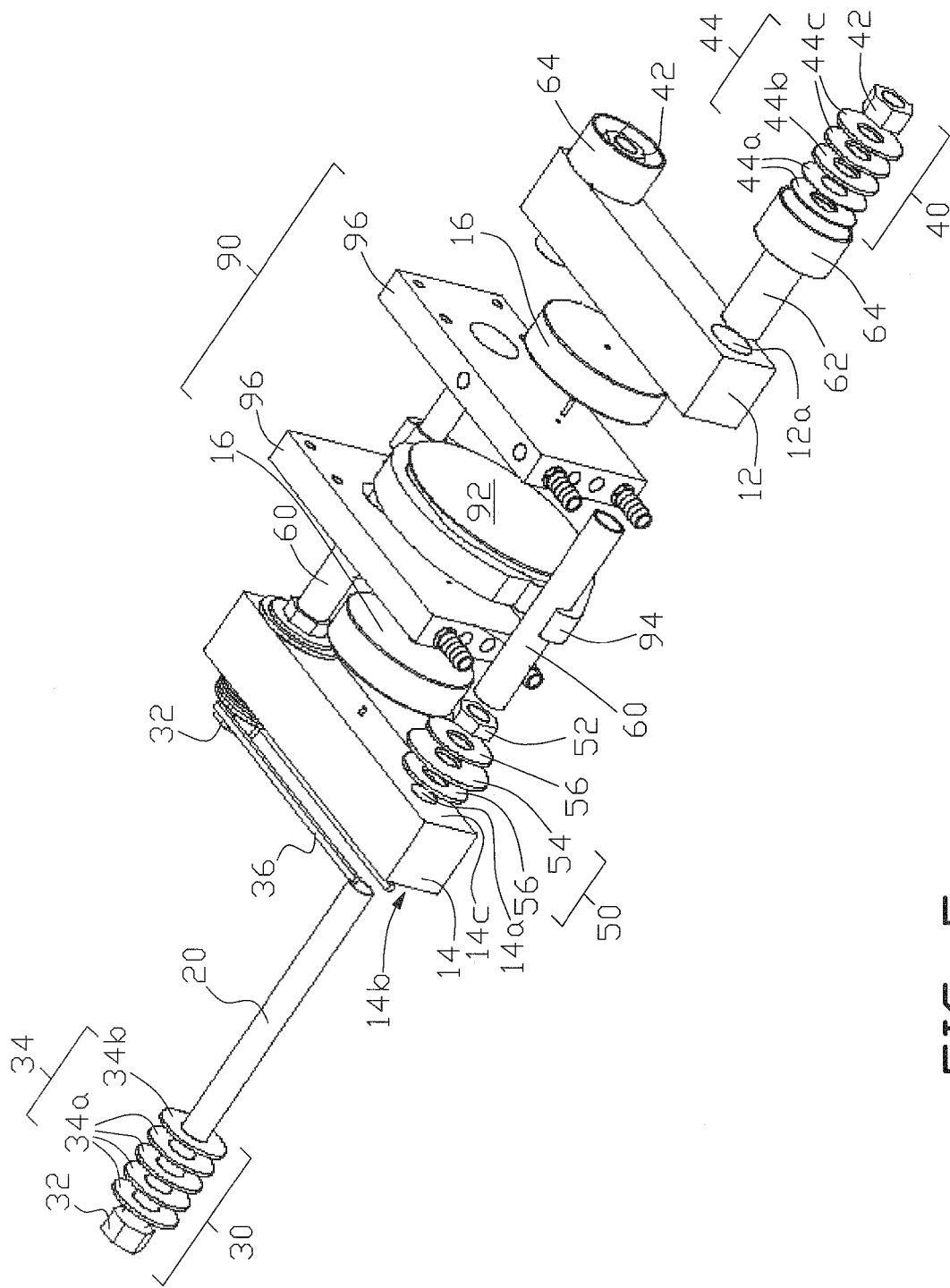
FIG. 5 is a partial exploded perspective view of one example of a clamping device of the present invention.

As best seen in FIG. 5 fastener assembly 30 at each of the first ends of rods 18 and 20 (only the assembly for rod 20 is illustrated in this exploded view since the assembly for rod 18 is substantially identical thereto) comprises end retaining fastener 32 and compressible assembly 34, which includes at least one compressible element, such as a spring or pre-load element, that may be, but is not limited to, a Belleville washer. In this non-limiting example compressible assembly 34 comprises four Belleville washers 34a, backed by optional flat washer 34b, which sits on the outer surface 14b of jaw 14. As best seen in FIG. 5 fastener assembly 40 at each of the second ends of rods 18 and 20 (only the assembly for rod 20 is illustrated since the assembly for rod 18 is substantially identical thereto) comprises retaining fastener 42 and compressible assembly 44, which includes at least one compressible element, such as a spring or pre-load element, that may be, but is not limited to a Belleville washer. In this non-limiting example compressible assembly 44 comprises one or more Belleville washers 44c, one or more optional electrical insulating washers 44a, and optional flat washer 44b, which is positioned between the Belleville and insulating washers.

As best seen in FIG. 5, clamp pressure set point assembly 50 on each of rods 18 and 20 (only the assembly for rod 20 is illustrated since the assembly for rod 18 is substantially identical thereto) comprises a clamp pressure adjustable set point element and a clamp pressure indicator element for indicating when the applied semiconductor clamping force (as further described below) is equal to a desired semiconductor clamping force. In this non-limiting example, the adjustable set point element comprises nut 52, and the indicator element comprises large diameter washer 54 interposed between washers 56 having diameters smaller than that of large diameter washer 54.

Insulating sleeves 60 may be optionally provided over tie rods 18 and 20 between jaw elements 12 and 14, if desired for example, to provide electrical insulation of the tie rods. Similarly electrical insulating sleeves 62 and cups 64 may be provided for sleeve insertion into openings 12a in jaw 12, and for in-cup seating of fastener assemblies 40.

One non-limiting example of assembly of a semiconductor clamping device of the present invention is as follows. First jaw 14 subassembly is formed as follows. End retaining fastener 32, such as, but not limited to, a jam nut, is threaded onto a suitably threaded first end region of tie rod 20. First end retaining fastener 32 can be locked in position on rod 20 by any suitable means, such as tack welding fastener 32 to rod 20. Belleville washers 34a, forming a compressible assembly, and optional flat washer 34b are placed on rod 20 adjacent to first end retaining fastener 32. The second end of rod 20 without an attached fastener is inserted into opening 14a from the outer surface 14b of jaw 14. This partial first jaw 14 subassembly with rod 20 passing through opening 14a is then inserted into a suitable compression fixture, such as a hydraulic press, to apply a relatively large external compression force between the first end of rod 20 and the inner surface 14c of first jaw 14 that is equal to one half of the desired clamping force to be applied between semiconductor device 92 and any associated semiconductor components making up the semiconductor assembly 90 in a particular application. Clamp pressure set point assembly 50 comprising small diameter washers 56; large diameter washer 54, which is positioned between the small diameter washers; and adjustable set point element 52 are inserted onto rod 20 adjacent to inner surface 14c of jaw 14 as shown in the figures. Small diameter washers 56 may be USS (US Steel) or SAE (Society of Automotive Engineers) flat washers while large diameter washer 54 may be a fender washer to provide extra wide surfaces relative to the surfaces of the small diameter washers. Adjustable set point element 52 may be a threaded nut which is adjustably located along the length of rod 20, which can be threaded at least for the required length of adjustment. With the external compression force still applied, clamp pressure adjustable set point element 52 is hand tightened to force washers 56 and 54 against the inner surface 14c of first jaw 14. At this point, adjustable set point element 52 can be locked into position on rod 20, for example, by tack welding the clamp pressure adjustable set point element to the rod. This partial jaw 14 subassembly is removed from the compression fixture to remove the external compression force so that the compression force between the first end of rod 20 and the clamp pressure set point assembly 50 is equal to one half of the desired semiconductor clamp compression force.

The above assembly and compression steps are then repeated for jaw 14 and tie rod 18 so that the compression force between the first end of rod 18 and the clamp pressure set point assembly 50 around rod 18 is also equal to one half of the desired semiconductor clamp compression force.

Optionally cross bars 36 may be provided and suitably attached between end retaining fasteners 32 on tie rods 18 and 20 as shown in FIG. 5 to further ensure that the fasteners do not move after compression forces have been established between the first ends of the tie rods and their associated clamp pressure set point assembly.

The above jaw 14 subassembly with connected tie rods 18 and 20 is then suitably joined with the other components of clamp apparatus 10 and semiconductor assembly 90 as described above. The final assembly step is to tighten retaining fasteners 42 at the second ends of rods 18 and 20 associated with second jaw 12 to compress the opposing jaws and pressure distribution elements against the opposing sides of semiconductor assembly 90. Preferably these two retaining fasteners are alternatively tightened for an equal number of turns, which represents equal increases in compression force at opposing ends of the tie rods, until the point is reached where large diameter washers 54 on rods 18 and 20 can be rotated by hand. At that point, namely when the compression force between the small and large diameter washers allows hand turning of the large diameter washer, the desired magnitude of compression force, has been applied equally across semiconductor assembly 90 by clamping apparatus 10 of the present invention.

To further ensure that equal clamp pressure is applied by compression on rod 18 and rod 20, a differential linear tolerance measurement can be made between appropriate positions along rods 18 and 20. For example the differential linear tolerance between inside facing surfaces of jaw elements 12 and 14 on both sides of the clamping device, as represented by distances $y_1$ and $y_2$ in FIG. 2, should be within a maximum tolerance, for example, 1/64-inch, to ensure equal clamp pressures.

The present invention may be advantageously used when semiconductor components are replaced in installed equipment to clamp the replacement semiconductor components to a desired compression force without the necessity of installing pressure force gauges in installed equipment that may not provide sufficient room for installation of the gauges.

In lieu of hand turning of large diameter washer 54, a torque calibrated turning tool may be used to turn the large diameter washer to observe the point at which the washer is free to turn.

In other examples of the invention the number of jaw elements and tie rods may change. For example the existing jaw elements may each be modified into a "+" arrangement wherein a tie rod is provided at each end of the "+" jaw arrangement for a total of four tie rods. A clamp pressure set point assembly 50 is associated with each of the four tie rods, each one of which is set at one quarter of the total semiconductor clamping pressure.

In other examples of the invention the tie rods may be suitably connected to either one or both of jaws rather than pass through the jaws as long as a compressive force can be applied between the jaws.

The above examples of the invention have been provided merely for the purpose of explanation, and are in no way to be construed as limiting of the present invention. While the invention has been described with reference to various embodiments, the words used herein are words of description and illustration, rather than words of limitations. Although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto, and changes may be made without departing from the scope of the invention in its aspects.

The invention claimed is:

1. A method of clamping a semiconductor assembly, the method comprising the steps of:
    attaching a first end retaining assembly to a first end of a first tie rod, the first end retaining assembly comprising a first end retaining element and at least one spring or pre-load element;
    passing the first tie rod through an opening near a first end of a first jaw to seat the at least one spring or pre-load element against an outer surface of the first jaw;
    compressing the at least one spring or pre-load element of the first end retaining assembly of the first tie rod by externally applying a first compression force between the first end of the first tie rod and an inner surface of the first jaw equal to one half of the first compression force to be applied across the semiconductor assembly;
    securing a first assembly comprising a large diameter washer interposed between two washers having diameters smaller than the large diameter washer around the first tie rod against the inner surface of the first jaw with a fastener;
    removing the externally applied first compression force;
    attaching a first end retaining assembly to a first end of a second tie rod, the first end retaining assembly comprising a first end retaining element and at least one spring or pre-load element;
    passing the second tie rod through an opening near a second end of the first jaw to seat the at least one spring or pre-loaded element against the outer surface of the first jaw;
    compressing the at least one spring or pre-load element of the first end retaining assembly of the second tie rod by externally applying a second compression force between the first end of the second tie rod and the inner surface of the first jaw equal to one half of the second compression force to be applied across the semiconductor assembly;
    securing a second assembly comprising a large diameter washer interposed between two washers having diameters smaller than the large diameter washer around the second tie rod against the inner surface of the first jaw with a fastener;
    removing the externally applied second compression force;
    positioning a first opposing semiconductor assembly side surface adjacent to a surface of a first pressure distribution element disposed between the inner surface of the first jaw and the semiconductor assembly;
    positioning a first opposing surface of a second pressure distribution element adjacent to a second opposing semiconductor assembly side surface;
    positioning a second opposing surface of the second pressure distribution element adjacent to the inner surface of a second jaw with the second ends of the first and second tie rods passing through openings near the opposing ends of the second jaw;
    attaching a second end retaining assembly to each of the second ends of the first and second tie rods, each second end retaining assembly comprising a second end retaining element and at least one spring or pre-load element; and
    compressing the at least one spring or pre-load element around the second ends of the first and second tie rods until the large diameter washer on each one of the first and second tie rods can be turned by hand.

2. The method of claim 1 wherein the step of compressing the at least one spring or pre-load element by externally applying the first compression force between the first end of the first tie rod and the inner surface of the first jaw, or the step of compressing the at least one spring or pre-load element by externally applying the second compression force between the first end of the second tie rod and the inner surface of the first jaw is performed with a hydraulic press.

3. The method of claim 2 further comprising the steps of making a differential linear tolerance measurement along the first and second tie rods and further compressing the at least one spring or pre-load element around the second end of the first or second tie rods until the differential linear tolerance measurement along the first and second tie rods is within a maximum tolerance.

4. A method of clamping a semiconductor assembly, the method comprising the steps of:
attaching a first end retaining assembly to a first end of a first tie rod, the first end retaining assembly comprising a first end retaining element and at least one spring or pre-load element;
passing the first tie rod through an opening near a first end of a first jaw to seat the at least one spring or pre-load element against an outer surface of the first jaw;
compressing the at least one spring or pre-load element of the first end retaining assembly of the first tie rod by externally applying a first compression force with a hydraulic press between the first end of the first tie rod and an inner surface of the first jaw equal to one half of the first compression force to be applied across the semiconductor assembly;
securing a first assembly comprising a large diameter washer interposed between two washers having diameters smaller than the large diameter washer around the first tie rod against the inner surface of the first jaw with a fastener;
removing the externally applied first compression force;
attaching a first end retaining assembly to a first end of a second tie rod, the first end retaining assembly comprising a first end retaining element and at least one spring or pre-load element;
passing the second tie rod through an opening near a second end of the first jaw to seat the at least one spring or pre-loaded element against the outer surface of the first jaw;
compressing the at least one spring or pre-load element of the first end retaining assembly of the second tie rod by externally applying a second compression force with a hydraulic press between the first end of the second tie rod and the inner surface of the first jaw equal to one half of the second compression force to be applied across the semiconductor assembly;
securing a second assembly comprising a large diameter washer interposed between two washers having diameters smaller than the large diameter washer around the second tie rod against the inner surface of the first jaw with a fastener;
removing the externally applied second compression force;
positioning a first opposing semiconductor assembly side surface adjacent to a surface of a first pressure distribution element disposed between the inner surface of the first jaw and the semiconductor assembly;
positioning a first opposing surface of a second pressure distribution element adjacent to a second opposing semiconductor assembly side surface;
positioning a second opposing surface of the second pressure distribution element adjacent to the inner surface of a second jaw with the second ends of the first and second tie rods passing through openings near the opposing ends of the second jaw;
attaching a second end retaining assembly to each of the second ends of the first and second tie rods, each second end retaining assembly comprising a second end retaining element and at least one spring or pre-load element; and
compressing the at least one spring or pre-load element around the second ends of the first and second tie rods until the large diameter washer on each one of the first and second tie rods can be turned by hand.

5. The method of claim 4 further comprising the steps of making a differential linear tolerance measurement along the first and second tie rods and further compressing the at least one spring or pre-load element around the second end of the first or second tie rods until the differential linear tolerance measurement along the first and second tie rods is within a maximum tolerance.

* * * * *